United States Patent
Chang

(10) Patent No.: US 10,872,969 B2
(45) Date of Patent: Dec. 22, 2020

(54) SEMICONDUCTOR DEVICE WITH COMBINED FIN-EDGE-CUT AND FIN-MAJOR-CUT AND METHOD OF MANUFACTURING THE SAME

(71) Applicant: TAIWAN SEMICONDUCTOR MANUFACTURING CO., LTD., Hsinchu (TW)

(72) Inventor: Shih-Ming Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/552,274

(22) Filed: Aug. 27, 2019

(65) Prior Publication Data

US 2020/0105911 A1    Apr. 2, 2020

Related U.S. Application Data

(60) Provisional application No. 62/738,577, filed on Sep. 28, 2018.

(51) Int. Cl.
| | |
|---|---|
| *H01L 29/66* | (2006.01) |
| *H01L 21/027* | (2006.01) |
| *H01L 29/78* | (2006.01) |
| *H01L 21/8234* | (2006.01) |
| *H01L 21/308* | (2006.01) |

(52) U.S. Cl.
CPC .... *H01L 29/66795* (2013.01); *H01L 21/0276* (2013.01); *H01L 21/3086* (2013.01); *H01L 21/823425* (2013.01); *H01L 21/823431* (2013.01); *H01L 29/7851* (2013.01)

(58) Field of Classification Search
CPC ........... H01L 29/66795; H01L 21/0276; H01L 29/7851; H01L 21/3086; H01L 21/823431
See application file for complete search history.

(56) References Cited

U.S. PATENT DOCUMENTS

| 9,129,839 B2 | 9/2015 | Shieh et al. | |
|---|---|---|---|
| 10,307,744 B2 * | 6/2019 | Albert | ..................... B01J 27/122 |
| 2013/0277759 A1 * | 10/2013 | Chen | ............... H01L 21/823431 |
| | | | 257/397 |
| 2018/0090491 A1 * | 3/2018 | Huang | .............. H01L 21/76232 |

* cited by examiner

*Primary Examiner* — Ahmed N Sefer
(74) *Attorney, Agent, or Firm* — McDermott Will & Emery LLP

(57) ABSTRACT

Manufacturing a semiconductor device includes forming a pad oxide layer on a semiconductor substrate. A hard mask layer is formed over the pad oxide layer. An anti-reflective layer (ARL) is formed over the hard mask layer. A first photoresist layer is formed over the ARL. The first photoresist layer is patterned and the hard mask layer and ARL are removed. Remaining portions of the first photoresist layer and the ARL are removed, and a patterned hard mask layer is formed. The pad oxide layer and the semiconductor substrate are etched to obtain a plurality of fins. A bottom layer is formed over and between the fins. A middle layer is formed over the bottom layer and a second photoresist layer is formed on the middle layer. The second photoresist layer is patterned to form an opening and a spacer is formed in an opening formed in the second photoresist layer.

20 Claims, 14 Drawing Sheets

SEMICONDUCTOR DEVICE WITH COMBINED FIN-EDGE-CUT AND FIN-MAJOR-CUT AND METHOD OF MANUFACTURING THE SAME

CROSS REFERENCE TO RELATED APPLICATION

This application claims priority of U.S. Provisional Patent Application No. 62/738,577 filed on Sep. 28, 2018, the entire contents of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Traditional planar thin film devices provide superior performance with low power consumption. To enhance the device controllability and reduce the substrate surface area occupied by the planar devices, the semiconductor industry has progressed into nanometer technology process nodes in pursuit of higher device density, higher performance, and lower costs. Challenges from both fabrication and design issues have resulted in the development of three-dimensional designs, such as a multi-gate field effect transistor (FET), including a fin field effect transistor (FinFET) and a gate-all-around (GAA) field effect transistor (FET). In a FinFET, a gate electrode is adjacent to three side surfaces of a channel region with a gate dielectric layer interposed therebetween. Because the gate structure surrounds (wraps) the fin on three surfaces (i.e., the top surface and the opposite lateral surfaces), the transistor essentially has three gates controlling (one gate at each of the top surface and the opposite lateral surfaces) the current through the fin or channel region. The fourth side of the bottom of the channel is far away from the gate electrode and thus is not under close gate control. In contrast, in a GAA FET, all side surfaces (i.e. the top surface, the opposite lateral surfaces, and the bottom surface) of the channel region are surrounded by the gate electrode, which allows for fuller depletion in the channel region and results in reduced short-channel effect due to steeper sub-threshold current swing (SS) and smaller drain induced barrier lowering (DML). As transistor dimensions are continually scaled down to sub 10-15 nm technology nodes, further improvements of the FinFETs and/or GAA FETs are required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
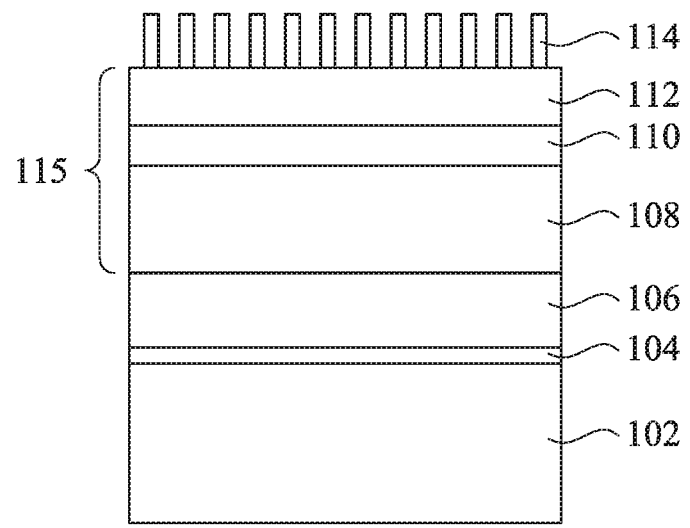
FIGS. 1A, 1B, 1C, 1D, 1E, 1F, 1G, 1H, 1J, 1K, 1L, 1M, and 1N are cross-sectional views of a fin cut process for removing fins, according to exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

While methods disclosed herein are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Terms like "simulate," "optimize," "adjust," "creating," "manufacture," "fabricate," "make," "form," "compare,"

"generate," "choose," "determine," "calculate," "measure," are used to describe operations of the disclosed methods, apparatus, or system. These terms denote the operations that are performed, for example, by one or more computers connected to or disconnected from a network and having a user interface to receive the user/designer's inputs and/or commands and a data communication interface or a network interface so as to exchange data with semiconductor manufacturing tools including, but not limited to, a lithography tool and an e-beam writer, and semiconductor testing (or characterization, measurement, or metrology) tools including, but not limited to, a scanning electron microscope. The operations that correspond to these terms can vary depending on the particular implementation and are readily discernible by one of ordinary skill in the art.

The embodiments disclosed are directed to a process flow that combines two fin cut process each for removing or "cutting" fin structures into a combined fin cut process. The process includes only one lithography process. Embodiments of the disclosure reduce the process cycle time and cost, and reduce the overlay error between two cut layers. The first fin cut process is referred to as a fin-edge-cut process (or a fine cut process, and the second fin cut process is referred to as a fin-major-cut process (or a course cut process). The combined fin cut process separates the etching process of the edge and major structure, and thereby minimizes effect of over-etching.

Some processes of manufacturing semiconductor devices, such as, fin field effect transistors (FinFETs) and/or gate-all-around (GAA) field effect transistors (FETs) involve forming all fins in the devices by lithography processes and spacer forming processes. After all fins are formed, a desired number of fins are removed by a single fin cut process. The single fin cut process damages adjacent fins causing device degradation. Another fin cut process that involves two (or more) cutting steps is used to avoid device degradation. However, the multi-cut process increases the costs and can introduce overlay error between two (or more) cut layers.

FIGS. 1A, 1B, 1C, 1D, 1E, 1F, 1G, 1H, 1J, 1K, 1L, 1M, and 1N are cross-sectional views of a fin cut process for removing fins, according to embodiments of the present disclosure. Please note that there is no FIG. 1I. It is understood that additional operations can be provided before, during, and after processes shown by FIGS. 1A, 1B, 1C, 1D, 1E, 1F, 1G, 1H, 1J, 1K, 1L, 1M, and 1N, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

Illustrated in FIG. 1A, a pad oxide layer (e.g., a $SiO_2$ buffer layer) 104 is grown by thermal oxidation on a semiconductor substrate 102. According to exemplary embodiments, the semiconductor substrate 102 is a silicon wafer. Alternatively or additionally, the semiconductor substrate 102 includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP.

A hard mask layer 106 is deposited on the pad oxide layer 104. In some embodiments, the hard mask layer is a silicon nitride (SiN) layer. An organic film 108 is deposited on the hard mask layer 106. In an embodiment, the organic film 108 includes amorphous carbon. An etch barrier layer 110 (also referred to as a capping layer) is deposited over the organic film 108. The organic film 108 is used because it is etched with extremely high selectivity to most spacer materials, such as oxides or nitrides, and high selectivity to most device materials, such as oxides, nitrides, tungsten, or polysilicon. In some embodiments, the organic film 108 is formed using plasma enhanced chemical vapor deposition (PECVD). In some embodiments, the etch barrier layer is formed of silicon oxynitride (SiON). In some embodiments, a second organic film may be deposited over the etch barrier layer 110, and a second etch barrier layer may be deposited over the second organic film. In some embodiments, the second etch barrier layer may also include SiON. In exemplary embodiments, the two etch barrier layers may include different materials, and these two films may include different materials. Different materials support different etch selectivities, which are useful during fabrication process.

A bottom anti-reflective coating (BARC) 112 is deposited over the etch barrier layer 110 (or over the topmost etch barrier layer in case of multiple etch barrier layers). The organic film 108, the etch barrier layer 110, and bottom anti-reflective coating 112 form an anti-reflective layer (ARL) 115. A photoresist layer 114 is deposited over the bottom anti-reflective coating 112 and patterned to define fins. The photoresist layer 114 is patterned using patterning techniques including, for example, electron-beam lithography, photolithography, or any other suitable process. In other embodiments, a hard mask layer is deposited instead of the photoresist layer 114. The hard mask may include materials such as silicon oxide, silicon nitride, or silicon oxynitride. Other suitable materials may be used. One way of forming the hard mask includes using a deposition process, such as a chemical vapor deposition (CVD) or a physical vapor deposition (PVD) process, and a patterning process, such as photolithography.

In some embodiments, the lithography operations of the photoresist layer include coating a photosensitive resist film over a substrate, exposing the resist film deposited over the substrate by an optical lithography tool or an electron beam writer, and developing the exposed resist film to form a resist pattern for an ion trim process or an etching process. The resist may include a positive tone resist or a negative tone resist. The resist film may include a single layer resist film or a multiple layer resist film.

In some embodiments, the coating the resist film over the substrate includes performing a dehydration operation before applying the resist film over the substrate. The dehydration operation enhances the adhesion of the resist film to the substrate in some embodiments. The dehydration operation may include baking the substrate at a high temperature for a duration of time, or applying a chemical such as hexamethyldisilizane (HMDS) to the substrate. Other embodiments also include a soft bake (SB) process to drive solvent out of the resist film and increase the mechanical strength of the resist film. Antireflective coating, such as the bottom antireflective coating (BARC) or a top antireflective coating (TARC) is applied below or above the resist layers in some embodiments.

Exposing the resist film deposited over the substrate includes using an optical exposing tool or a charged particle exposing tool. The optical lithography tool may include an I-line, a deep ultraviolet (DUV), an extreme ultraviolet (EUV) tool, or ArF and KrF laser tools. The charged particle exposing tool includes an electron beam or an ion beam tool. The optical exposing tool includes using a mask in some embodiments. The mask may be a binary mask (BIM), a super binary mask (SBIM), or a phase shift mask (PSM), which includes an alternative phase shift mask (alt. PSM) or an attenuated phase shift mask (att. PSM). Developing the exposed resist film includes a post exposure bake (PEB), a post development bake (PDB) process, or a combination thereof in some embodiments.

Figure 1B:
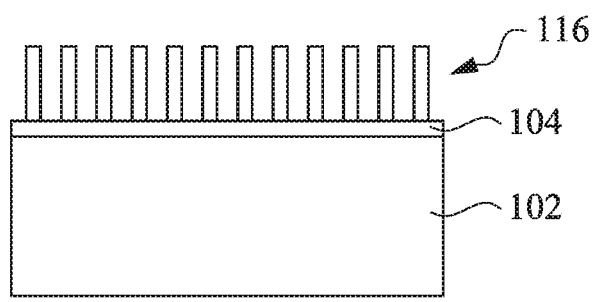
Figure 1C:
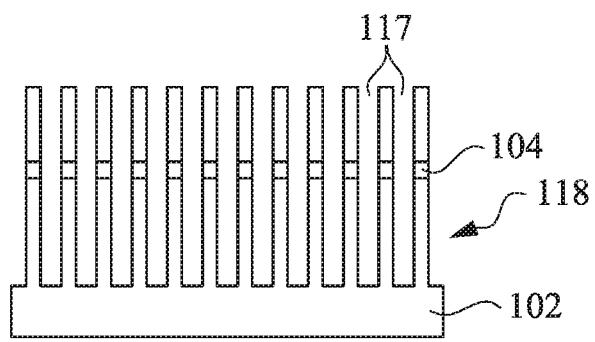

In FIG. 1B, an etching operation is performed on the hard mask layer 106 and anti-reflective layer 115 using the patterned photoresist layer 114 to remove portions of the anti-reflective layer 115 and the hard mask layer 106 exposed by the patterned photoresist layer 114. Remaining portions of the patterned photoresist layer 114 and the anti-reflective layer 115 are removed, and thereby a patterned hard mask layer 116 is obtained. The photoresist layer 114 is removed by a suitable photoresist stripping or plasma ashing operation. For example, in some embodiments, a suitable solvent is used to remove the photoresist layer 114. In some other embodiments, the photoresist layer 114 is removed by oxygen plasma ashing operation. As illustrated in FIG. 1C, further etching is performed to etch the pad oxide layer 104 and the semiconductor substrate 102 using the patterned hard mask layer 116, and thereby obtain fins 118 and trenches 117 between adjacent fins 118.

Various types of etching operations may be used to remove the hard mask layer 106, the photoresist layer 114, and the anti-reflective layer 115, and the second etch barrier layer and the second organic film, if present. In some embodiments, the etching operations are performed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In other embodiments, the etching operation is performed using a wet etchant such as, but not limited to, $HF:HNO_3$ solution, $HF:CH_3COOH:HNO_3$, or $H_2SO_4$ solution and $HF:H_2O_2:CH_3COOH$.

In some embodiments, a dry etching operation is used. The dry etching operation may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments, a combination of dry etching techniques and wet etching techniques are used to perform the etching operations. In some embodiments, the photoresist layer 114 is removed prior to removing the anti-reflective layer 115 and the hard mask layer 106. The photoresist layer 114 is removed using a suitable stripping or plasma ashing operation.

In some other embodiments the fins 118 are patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. The sacrificial layer may include materials such as silicon oxide, silicon nitride, or silicon oxynitride. Other suitable materials may be used. One way of forming the sacrificial layer includes using a deposition process, such as a chemical vapor deposition (CVD) or a physical vapor deposition (PVD) process. Spacers are formed alongside the patterned sacrificial layer using a self-aligned process. The sacrificial layer is then removed, and the remaining spacers may then be used to pattern the fins.

Figure 1D:
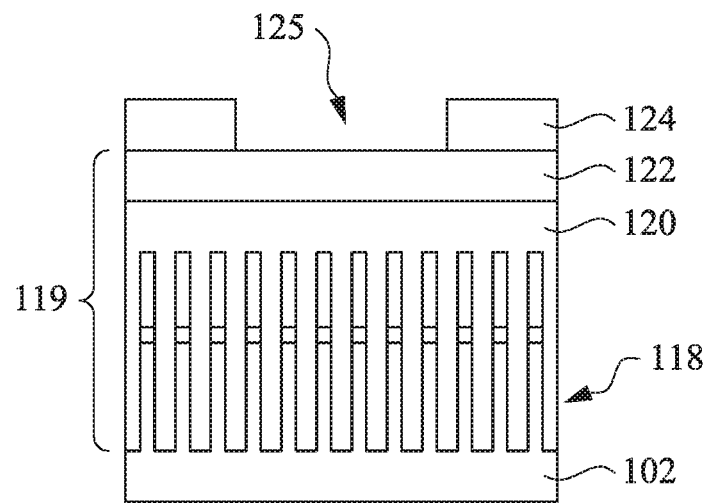

As shown in FIG. 1D, a bottom layer (BL) 120 is deposited in the trenches 117 and over the fins 118. A middle layer (ML) 122 is deposited over the bottom layer 120. The bottom layer 120 and the middle layer 122 comprise an anti-reflective layer 119. A photoresist layer 124 is deposited over the middle layer 122 and patterned to form an opening 125, and thereby define a single-cut fin area. In some embodiments, the bottom layer, the middle layer, and the photosensitive layer form a trilayer resist. The photosensitive layer is a photoresist in some embodiments. The bottom layer 120 is an organic layer in some embodiments. In some embodiments, the bottom layer 120 has a planarized upper surface. In some embodiments, the bottom layer includes a polymer. In some embodiments, the middle layer 122 includes a silicon-containing inorganic polymer. In other embodiments, the middle layer 122 includes a siloxane polymer. In other embodiments, the middle layer 122 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials.

Figure 1E:
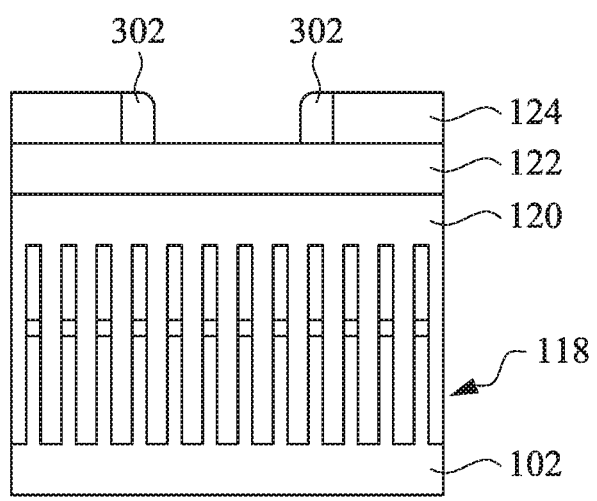

In FIG. 1E, spacers 302 are formed inside the opening 125 and along a periphery of the opening 125. The spacers 302 contact the sidewalls of the opening 125. A width of the spacer 302 is equal to the width of the edge-cut (discussed below). The spacers 302 function as a hard mask layer and may include materials such as silicon oxide, silicon nitride, or silicon oxynitride. Other suitable materials may be used. One way of forming the hard mask includes using a deposition process, such as a chemical vapor deposition (CVD) or a physical vapor deposition (PVD) process.

Figure 1F:
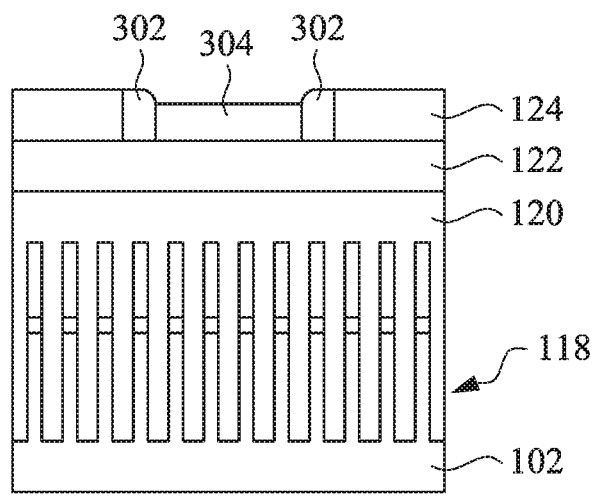
Figure 1G:
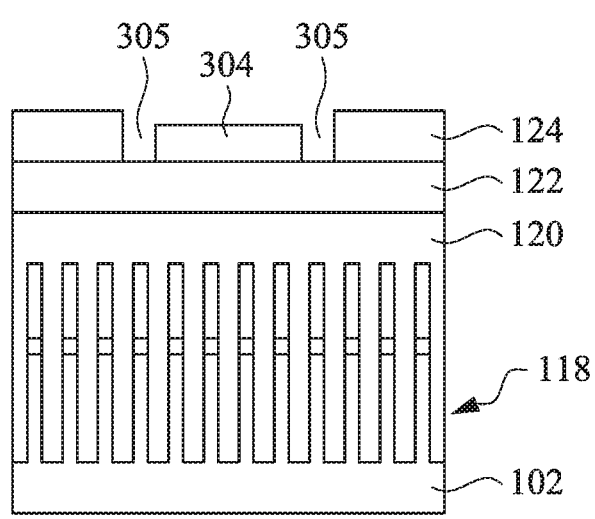

Another way of forming the spacers 302 is to form a conformal coating of the spacer material over the photoresist layer 124 and the opening 125 followed by anisotropic etching of the conformal coating. In FIG. 1F, a first plug material 304 is deposited between the spacers 302. The first plug material 304 is made of one or more of silicon oxide, silicon nitride, SiON, SiOC, SiOCN, SiCN, aluminum oxide, AlN, AlC, ALOC, $HfO_2$, organic material and any other suitable dielectric material. The first plug material 304 may be formed using a deposition process, such as a chemical vapor deposition (CVD) or a physical vapor deposition (PVD) process. Then, as illustrated, in FIG. 1G, the spacers 302 are removed (e.g., etched) to create the open area for the edge-cut 305.

Figure 1H:
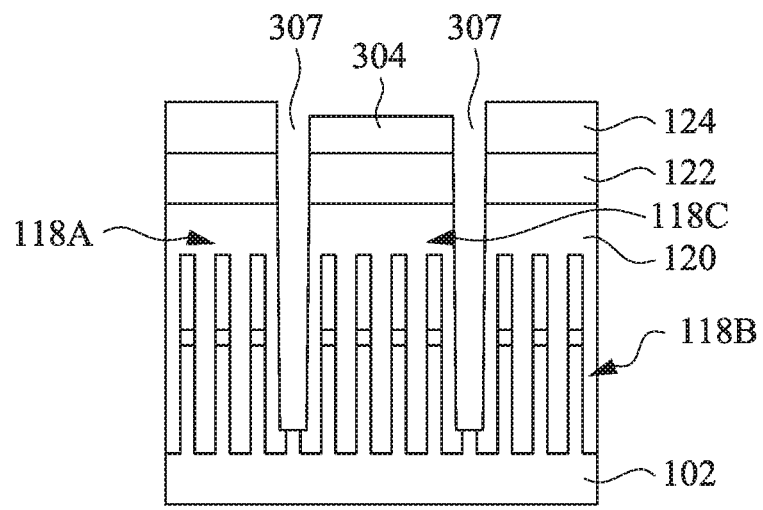

As illustrated in FIG. 1H, a first etching operation is performed to remove fins 118 below the edge-cut 305, and thereby create groups of fins 118A and 118B on opposing sides of a central group of fins 118C. The fins 118A and 118B are separated from the fins 118C by a trench 307 formed by the first etching operation.

In some embodiments, the etching operations are performed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In other embodiments, the etching operation is performed using a wet etchant such as, but not limited to, $HF:HNO_3$ solution, $HF:CH_3COOH:HNO_3$, or $H_2SO_4$ solution and $HF:H_2O_2:CH_3COOH$.

In some embodiments, a dry etching operation is used. The dry etching operation may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments, a combination of dry etching techniques and wet etching techniques are used to perform the etching operations.

Figure 1J:
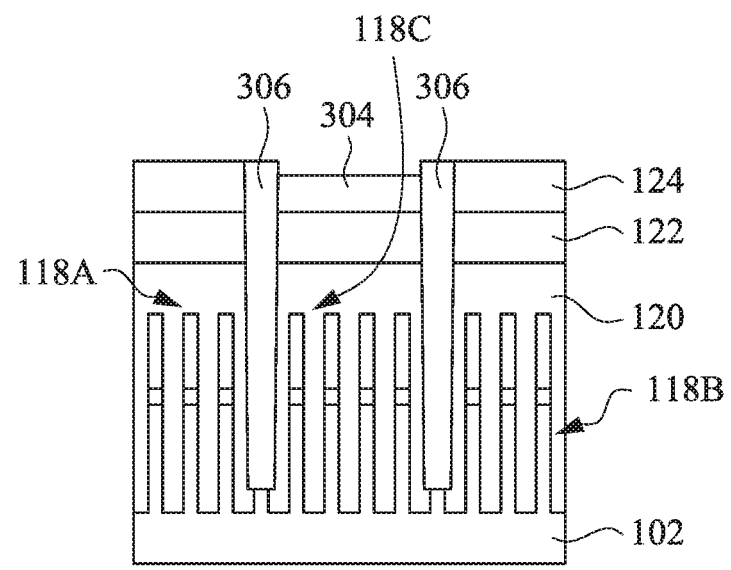
Figure 1K:
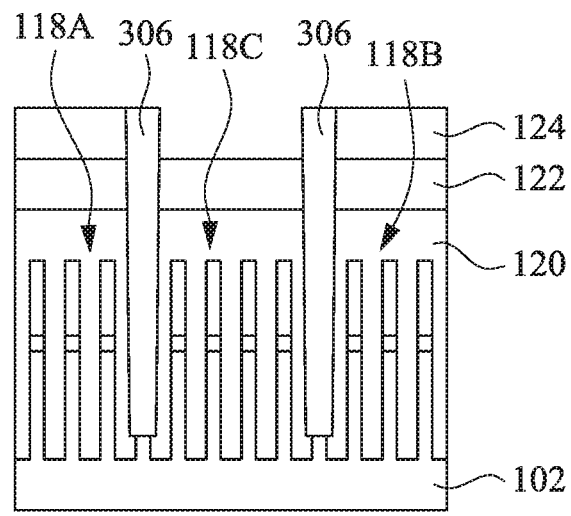

As illustrated in FIG. 1J, the trench 307 is filled with a second plug material 306. The second plug material 306 is different from the first plug material 304 in some embodiments. In some embodiments, the second plug material 306 is made of one or more of silicon oxide, silicon nitride, SiON, SiOC, SiOCN, SiCN, aluminum oxide, AlN, AlC, ALOC, $HfO_2$, organic material and any other suitable dielectric material. In some embodiments, the first plug material 304 and the second plug material 306 are made of different material than bottom layer 120 and/or middle layer 122. The second plug material 306 may be formed using a deposition process, such as a chemical vapor deposition (CVD) or a physical vapor deposition (PVD) process. Then, the first plug material 304 is removed, as shown in FIG. 1K.

Figure 1L:
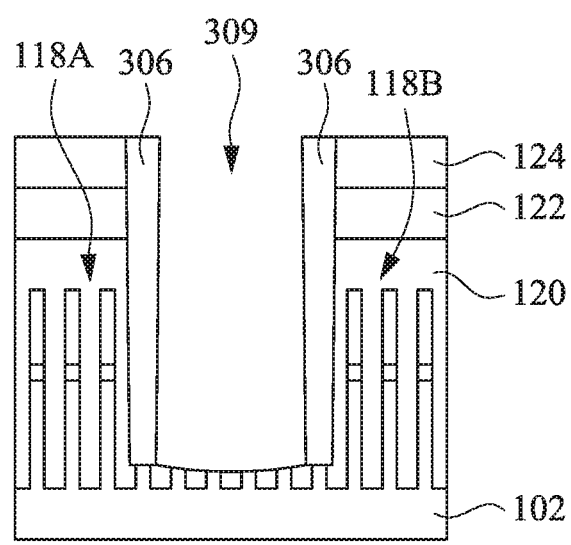

As shown in FIG. 1L, etching is subsequently performed to remove the center fins 118c, and the portions of the middle layer 122 and the bottom layer 120 below the first plug material 304, and thereby form a trench 309. In some embodiments, a lower portion of the fins 118C remains after the etching operation. Referring to FIG. 1L, the second plug material is subsequently removed using a suitable etching operation.

In some embodiments, etching operations are performed to remove the first plug material, the center fins 118c, and the portions of the middle layer 122 and the bottom layer 120 below the first plug material 304. The etching operations may be performed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In other embodiments, the etching operations are performed using a wet etchant such as, but not limited to, $HF:HNO_3$ solution, $HF:CH_3COOH:HNO_3$, or $H_2SO_4$ solution and $HF:H_2O_2:CH_3COOH$.

In some embodiments, dry etching operations are used. The dry etching operations may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments, a combination of dry etching techniques and wet etching techniques are used to perform the etching operations.

Figure 1M:
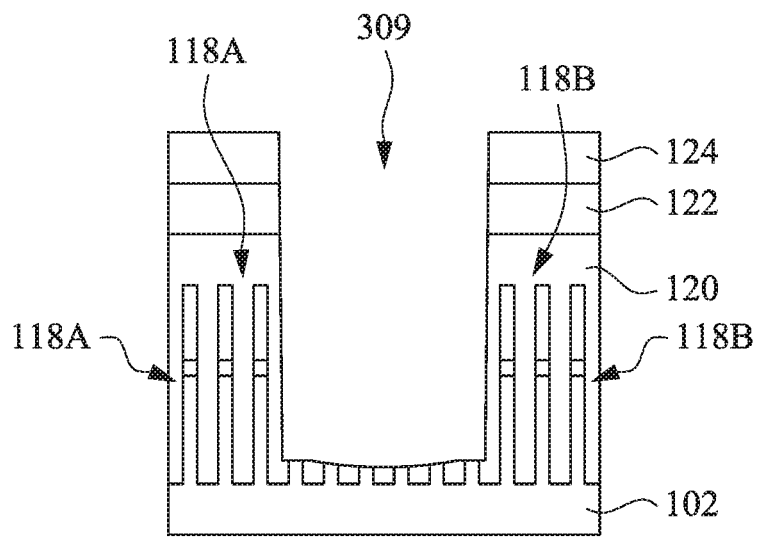

As illustrated in FIG. 1M, after the etching operation, the semiconductor substrate 102 includes the groups of fins 118A and 118B on opposing sides of the semiconductor substrate 102. The remaining fins 118A and 118B are covered with the portions of bottom layer 120 and the middle layer 122 remaining after the operations in FIGS. 1L and 1M.

Figure 1N:
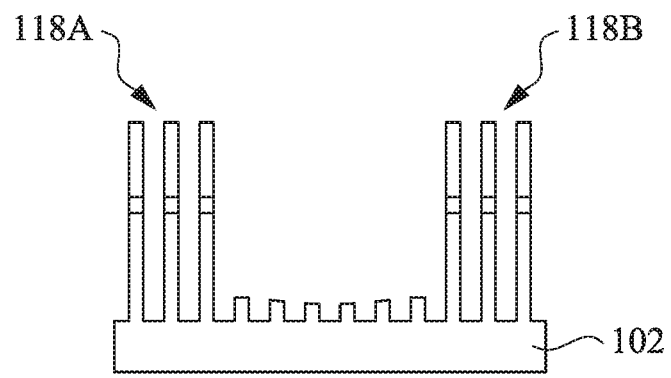

The remaining portions of the photoresist layer 124, bottom layer 120, and the middle layer 122 are removed to obtain the semiconductor substrate 102 having fins 118A and 118B separated by a fin cut region as shown in FIG. 1N. In some embodiments, the etching operations are performed to remove the photoresist layer 124, and portions of bottom layer 120 and the middle layer 122. The etching operation may use a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In other embodiments, the etching operation is performed using a wet etchant such as, but not limited to, $HF:HNO_3$ solution, $HF:CH_3COOH:HNO_3$, or $H_2SO_4$ solution and $HF:H_2O_2:CH_3COOH$.

In some embodiments, a dry etching operation is used. The dry etching operation may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In some embodiments, a combination of dry etching techniques and wet etching techniques are used to perform the etching operations.

In some embodiments, the photoresist layer 114 is removed prior to removing the portions of bottom layer 120 and the middle layer 122. The photoresist layer 114 is removed using a suitable stripping or plasma ashing operation. For example, in some embodiments, a suitable solvent is used to remove the photoresist layer 114. In some other embodiments, the photoresist layer 114 is removed by an oxygen plasma ashing operation.

FIGS. 2A, 2B, 2C, 2D, 2E, 2F, 2G, 2H, 2J, and 2K are cross-sectional views of a fin cut process for removing fins, according to example embodiments. Please note that there is no FIG. 2I. It is understood that additional operations can be provided before, during, and after processes shown by FIGS. 2A, 2B, 2C, 2D, 2E, 2F, 2G, 2H, 2J, and 2K, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

Figure 2A:
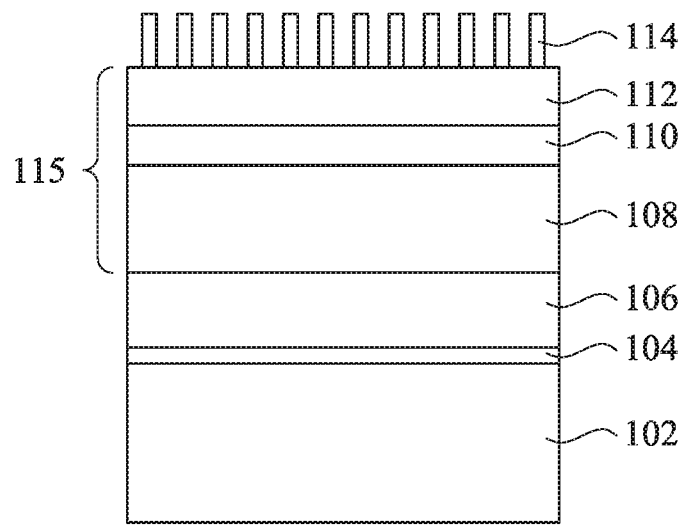
FIGS. 2A, 2B, 2C, 2D, 2E, 2F, 2G, 2H, 2J, and 2K are cross-sectional views of a fin cut process for removing fins, according to exemplary embodiments.

As illustrated in FIG. 2A, a pad oxide layer (e.g., a $SiO_2$ buffer layer) 104 is formed, such as by thermal oxidation, on a semiconductor substrate 102. According to an embodiment, the semiconductor substrate 102 is a silicon wafer. Alternatively or additionally, the semiconductor substrate 102 includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP.

A hard mask layer 106 is deposited on the pad oxide layer 104. In some embodiments, the hard mask layer 106 is a silicon nitride (SiN) layer. An organic film 108 is deposited on the hard mask layer 106. In an embodiment, the organic film 108 includes amorphous carbon. An etch barrier layer 110 (also referred to as a capping layer) is deposited over the organic film 108. In some embodiments, the etch barrier layer is formed of silicon oxynitride (SiON). In some embodiments, a second organic film is deposited over the etch barrier layer 110, and a second etch barrier layer is deposited over the second organic film. In some embodiments, the second etch barrier layer includes SiON. In exemplary embodiments, the two etch barrier layers include different materials, and the two organic films include different materials. Different materials support different etch selectivities, which are useful during fabrication process.

A bottom anti-reflective coating (BARC) 112 is deposited over the etch barrier layer 110 (or over the topmost etch barrier layer n case of multiple etch barrier layers). The organic film 108, the etch barrier layer 110, and the bottom anti-reflective coating 112 form an anti-reflective layer (ARL) 115. A photoresist layer 114 is deposited over the bottom anti-reflective coating 112 and patterned to define fins. The photoresist layer 114 is patterned using patterning techniques including, for example, electron-beam lithography, photolithography, or any other suitable process. In other embodiments, a hard mask layer is deposited instead of the photoresist layer 114. The hard mask may include materials such as silicon oxide, silicon nitride, or silicon oxynitride. Other suitable materials may be used. One way of forming the hard mask includes using a deposition process, such as a chemical vapor deposition (CVD) or a physical vapor deposition (PVD) process, and a patterning process, such as photolithography.

In some embodiments, the lithography operations of the photoresist layer include coating a photosensitive resist film over a substrate, exposing the resist film deposited over the substrate by an optical lithography tool or an electron beam writer, and developing the exposed resist film to form a resist pattern for an ion trim process or an etching process. The resist may include a positive tone resist or a negative tone resist. The resist film may include a single layer resist film or a multiple layer resist films.

In some embodiments, the coating the resist film over the substrate includes performing a dehydration operation before applying the resist film over the substrate, as previously disclosed. In some embodiments, a soft bake (SB) operation is performed to drive solvent out of the resist film and increase the mechanical strength of the resist film. An antireflective coating, such as the bottom antireflective coating (BARC) or a top antireflective coating (TARC) is applied below or above the resist layers in some embodiments.

Exposing the resist film deposited over the substrate includes using an optical exposing tool or a charged particle exposing tool. The optical lithography tool may include an I-line, a deep ultraviolet (DUV), an extreme ultraviolet (EUV) tool, or ArF and KrF laser tools. The charged particle exposing tool includes an electron beam or an ion beam tool. The optical exposing tool includes using a mask in some embodiments. The mask may be a binary mask (BIM), a super binary mask (SBIM), or a phase shift mask (PSM), which includes an alternative phase shift mask (alt. PSM) or an attenuated phase shift mask (att. PSM). Developing the exposed resist film includes a post exposure bake (PEB), a post development bake (PDB) process, or a combination thereof in some embodiments.

Figure 2B:
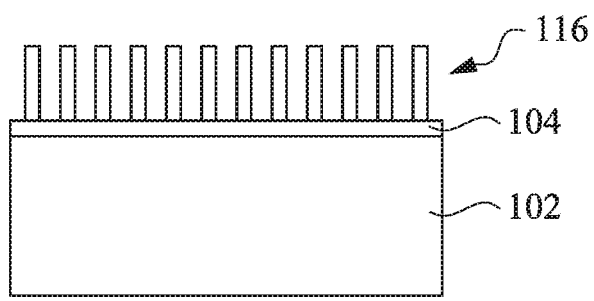
Figure 2C:
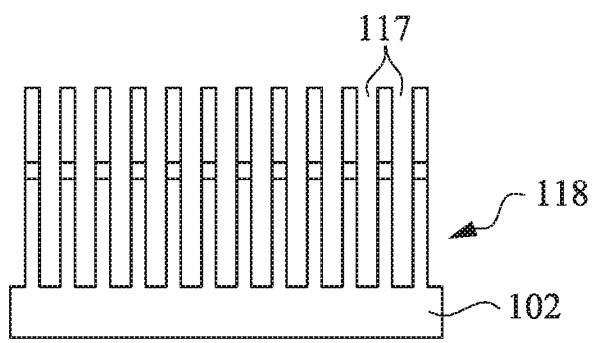

In FIG. 2B, etching operations are performed on the hard mask layer 106 and anti-reflective layer 115 to form a patterned hard mask layer 116. The photoresist layer 114 is removed by a suitable photoresist stripping or plasma ashing operation. For example, in some embodiments, a suitable solvent is used to remove the photoresist layer 114. In some other embodiments, the photoresist layer 114 is removed by oxygen plasma ashing operation. As illustrated in FIG. 2C, further etching operations are performed to etch the pad oxide layer 104 and the semiconductor substrate 102 using the patterned hard mask layer 116, and thereby obtain fins 118 and trenches 117 between adjacent fins 118.

Various types of etching operations may be used to remove the hard mask layer 106, the photoresist layer 114, and the anti-reflective layer 115, and the second etch barrier layer and the second organic film, if present. In some embodiments, the etching operations are performed using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. In other embodiments, the etching operation is performed using a wet etchant such as, but not limited to, $HF:HNO_3$, $HF:CH_3COOH:HNO_3$, or $H_2SO_4$ solution and $HF:H_2O_2:CH_3COOH$.

In some embodiments, a dry etching operation is used. The dry etching operation may use an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In some embodiments, a combination of dry etching techniques and wet etching techniques are used to perform the etching operations. In some embodiments, the photoresist layer 114 is removed prior to removing the anti-reflective layer 115 and the hard mask layer 106.

In some other embodiments the fins 118 are patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. The sacrificial layer may include materials such as silicon oxide, silicon nitride, or silicon oxynitride. Other suitable materials may be used. One way of forming the sacrificial layer includes using a deposition process, such as a chemical vapor deposition (CVD) or a physical vapor deposition (PVD) process. Spacers are formed alongside the patterned sacrificial layer using a self-aligned process. The sacrificial layer is then removed, and the remaining spacers may then be used to pattern the fins.

Figure 2D:
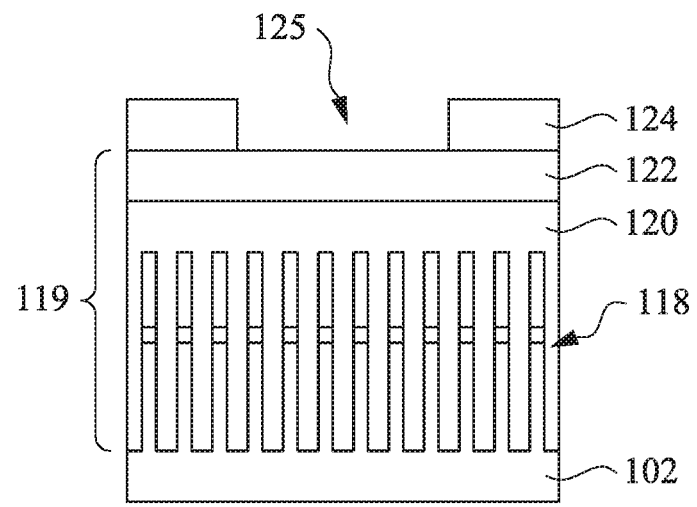

As shown in FIG. 2D, a bottom layer (BL) 120 is deposited in the trenches 117 and over the fins 118. A middle layer (ML) 122 is deposited over the bottom layer 120. The bottom layer 120 and the middle layer ML comprise an anti-reflective layer 119. A photoresist layer 124 is deposited over the middle layer 122 and patterned to form an opening 125, thereby defining a single-cut fin area. In some embodiments, the bottom layer 120 is an organic layer. In some embodiments, the bottom layer 120 has a planarized upper surface. In some embodiments, the bottom layer includes a polymer. In some embodiments, the middle layer 122 includes a silicon-containing inorganic polymer. In other embodiments, the middle layer 122 includes a siloxane polymer. In other embodiments, the middle layer 122 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials.

Figure 2E:
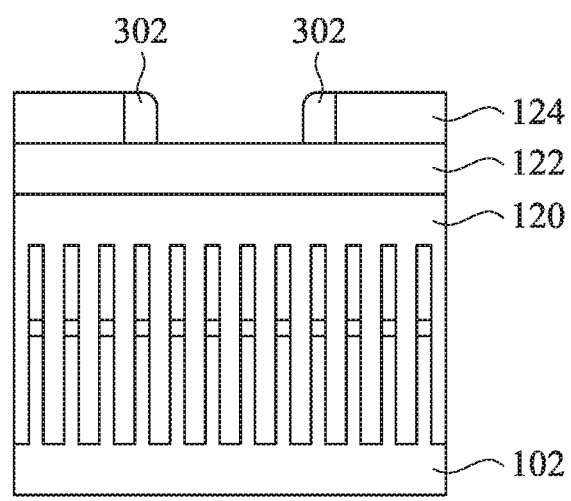

In FIG. 2E, spacers 302 are formed inside the opening 125. The spacers 302 contact the sidewalls of the opening 125. A width of the spacer 302 is equal to the width of the edge-cut (discussed below). The spacers 302 function as a hard mask layer and may include materials such as silicon oxide, silicon nitride, or silicon oxynitride. Other suitable materials may be used. One way of forming the hard mask includes using a deposition process, such as a chemical vapor deposition (CVD) or a physical vapor deposition (PVD) process. Another way of forming the spacers 302 is to form a conformal coating of the spacer material over the photoresist layer 124 and the opening 125 followed by anisotropic etching of the conformal coating.

Figure 2F:
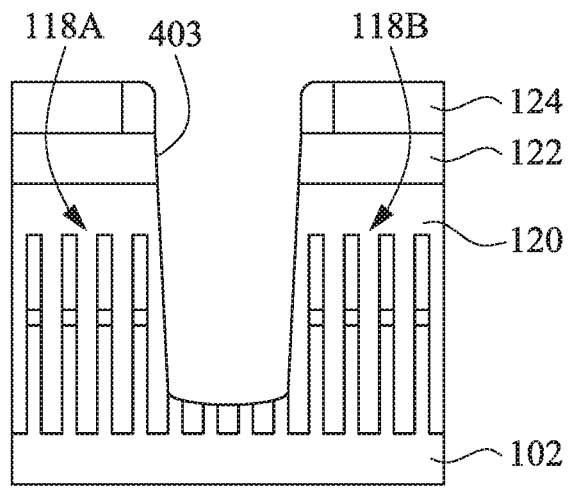

As illustrated in FIG. 2F, an etching operation is subsequently performed to remove fins 118 below portions of the opening 125 not occupied by the spacers 302. In some embodiments, wet etching techniques, dry etching techniques, or a combination thereof as discussed above are used to perform the etching operations. The etching operation also removes portions of the middle layer 122 and the bottom layer 120 below the portions of the opening 125 not occupied by the spacers 302. A trench 403 is formed by the removal of fins 118 and portions of the middle layer 122 and the bottom layer 120 below the portions of the opening 125 not occupied by the spacers 302. The etching operation thus results in groups of fins 118A and 118B on opposing sides of the trench 403. In some embodiments, a lower portion of the fins 118 below portions of the opening 125 not occupied by the spacers 302 remains after the etching operation.

Figure 2G:
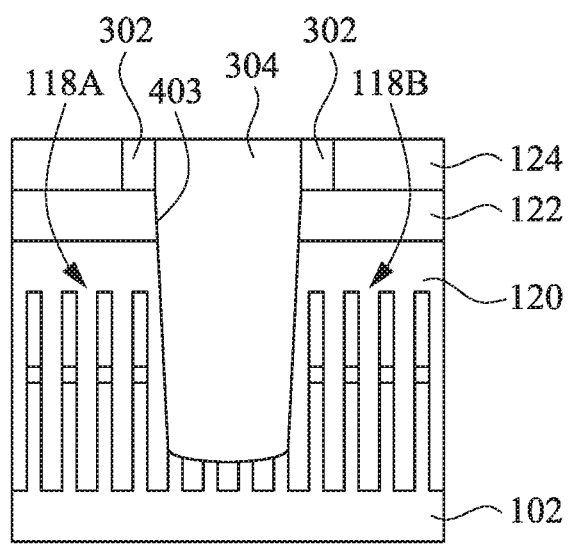

As illustrated in FIG. 2G, plug material 304 is used to fill the trench 403. The plug material 304 is made of one or more of silicon oxide, silicon nitride, SiON, SiOC, SiOCN, SiCN, aluminum oxide, AlN, AlC, ALOC, HfO$_2$, organic material and any other suitable dielectric material. One way of depositing the plug material 304 includes using a deposition process, such as a chemical vapor deposition (CVD) or a physical vapor deposition (PVD) process.

Figure 2H:
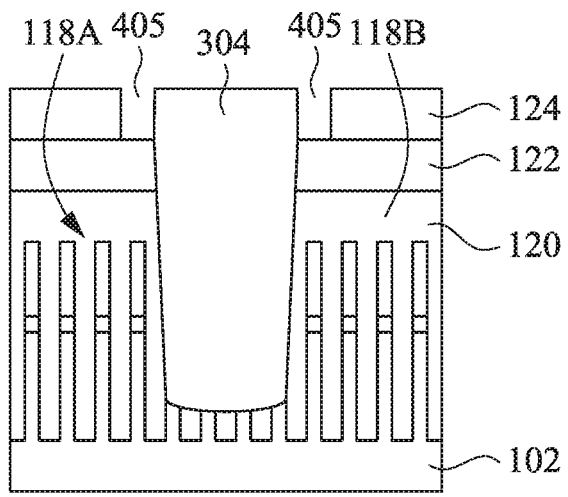

As shown in FIG. 2H, the spacers 302 are removed to create an edge-cut 405. Materials included in the spacers 302 have a different etch rate than materials in the photoresist layer 124, the middle layer 122, and the plug material 304. Thus, it is possible to selectively remove the spacers 302 without removing the photoresist layer 124, the middle layer 122, and the plug material 304.

Figure 2J:
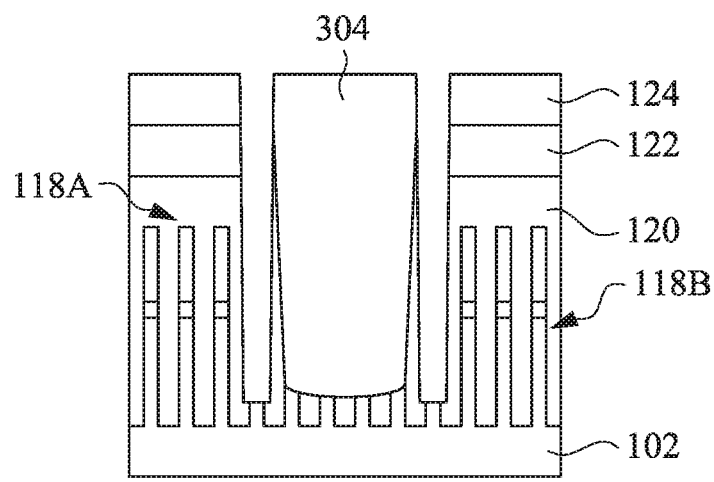
Figure 2K:
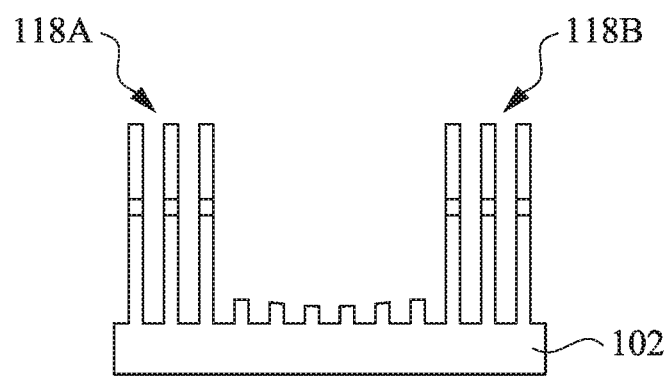

As shown in FIG. 2J, an etching operation is performed to remove one or more fins from the group of fins 118A and 118B that are below the edge-cut 405. Then, as illustrated in FIG. 2K, the photoresist layer 124, and bottom layer 120 and middle layer 122 are removed to obtain the semiconductor substrate 102 having fins 118A and 118B at the opposite sides of the fin cut region.

The etching operations use a wet etchant such as, but not limited to, ammonium hydroxide (NH$_4$OH), tetramethylammonium hydroxide (TMAH), ethylenediamine pyrocatechol (EDP), or potassium hydroxide (KOH) solutions. In other embodiments, the etching operation is performed using a wet etchant such as, but not limited to, HF:HNO$_3$ solution, HF:CH$_3$COOH:HNO$_3$, or H$_2$SO$_4$ solution and HF:H$_2$O$_2$:CH$_3$COOH.

In some embodiments, a dry etching operation is used. The dry etching operation may use an oxygen-containing gas, a fluorine-containing gas (e.g., CF$_4$, SF$_6$, CH$_2$F$_2$, CHF$_3$, and/or C$_2$F$_6$), a chlorine-containing gas (e.g., Cl$_2$, CHCl$_3$, CCl$_4$, and/or BCl$_3$), a bromine-containing gas (e.g., HBr and/or CHBr$_3$), an iodine-containing gas, other suitable gases and/or plasmas, and/or combinations thereof. In some embodiments, a combination of dry etching techniques and wet etching techniques are used to perform the etching operations.

In some embodiments, the photoresist layer 124 is removed prior to removing the portions of bottom layer 120 and the middle layer 122. The photoresist layer 124 is removed using a suitable stripping or plasma ashing operation. For example, in some embodiments, a suitable solvent is used to remove the photoresist layer 124. In some other embodiments, the photoresist layer 124 is removed by an oxygen plasma ashing operation.

Figure 3:
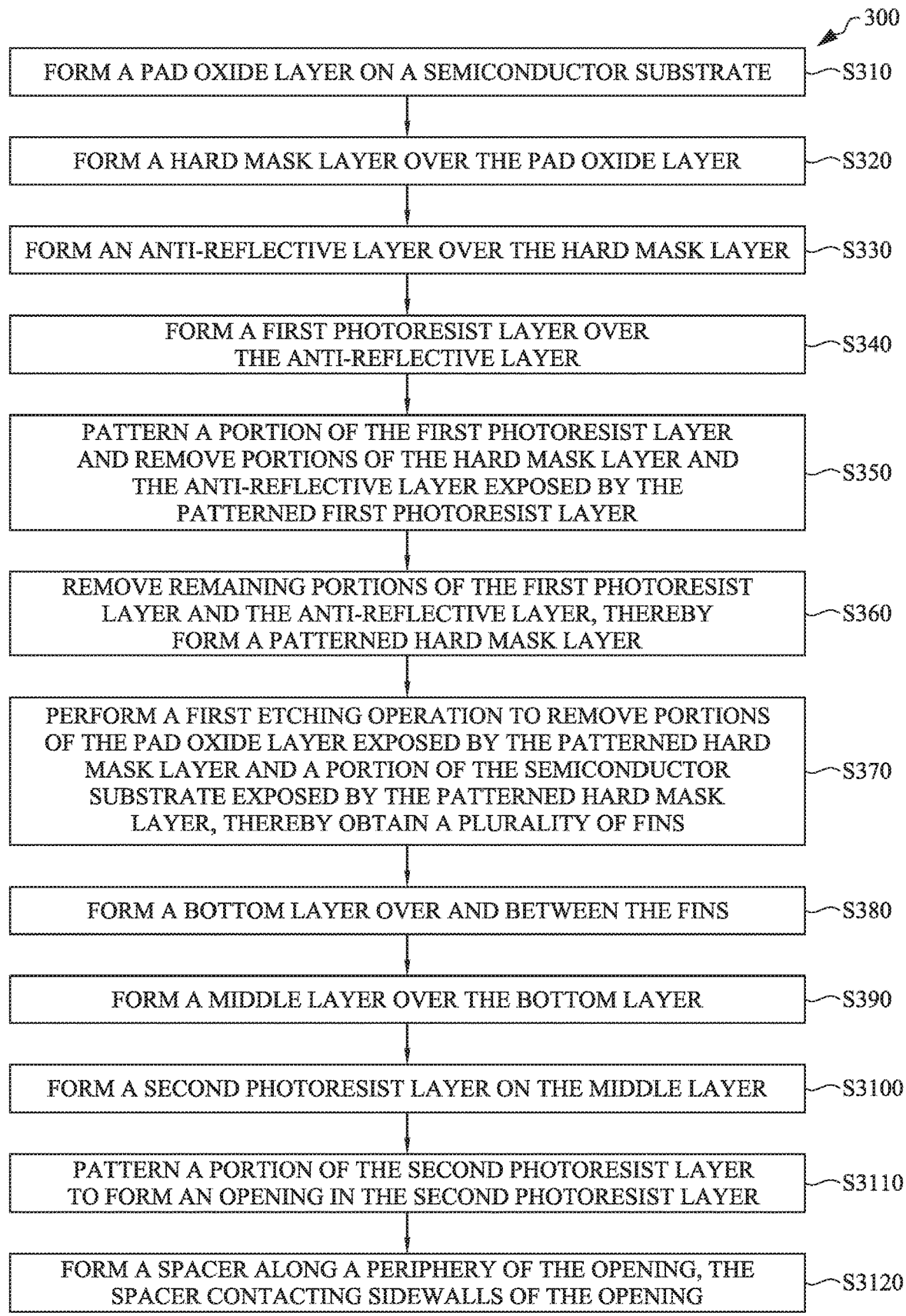
FIG. 3 is a flowchart illustrating a method of manufacturing a semiconductor device according to an embodiment of the present disclosure.

An embodiment of the present disclosure is a method 300 of manufacturing a semiconductor device according to the flowchart illustrated in FIG. 3. It is understood that additional operations can be provided before, during, and after processes discussed in FIG. 3, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method 300 includes an operation S310 of forming a pad oxide layer on a semiconductor substrate. In operation S320, a hard mask layer is formed over the pad oxide layer. An anti-reflective layer is formed over the hard mask layer in operation S330. In some embodiments, the anti-reflective layer includes an organic film, an etch barrier layer, and a bottom anti-reflective coating (BARC). In operation S340, a first photoresist layer is formed over the anti-reflective layer. In operation S350, portion of the first photoresist layer is patterned and portions of the anti-reflective layer and the hard mask layer exposed by the patterned first photoresist layer are removed. The first photoresist layer is patterned by selective exposure to actinic radiation in some embodiments, such as electromagnetic radiation including ultraviolet radiation and ultraviolet radiation, and particle beams, including electron beam and ion beam, followed by developing using a suitable developer. In operation S360, remaining portions of the first photoresist layer and the anti-reflective layer are removed, and thereby a patterned hard mask layer is formed. In operation S370, a first etching operation is performed to remove portions of the pad oxide layer exposed by the patterned hard mask layer and a portion of the semiconductor substrate exposed by the patterned hard mask layer, thereby a plurality of fins are obtained. In some embodiments, dry etching techniques, wet etching techniques, or a combination of dry etching techniques and wet etching techniques are used to perform the etching operations. In operation S380, a bottom layer is formed over and between the fins, and in operation S390, a middle layer is formed over the bottom layer. In operation S3100, a second photoresist layer is formed on the middle layer. In operation S3110, a portion of the second photoresist layer is patterned to form an opening in the second photoresist layer. In operation S3120, a spacer is formed along a periphery of the opening and contacting sidewalls of the opening.

Figure 4A:
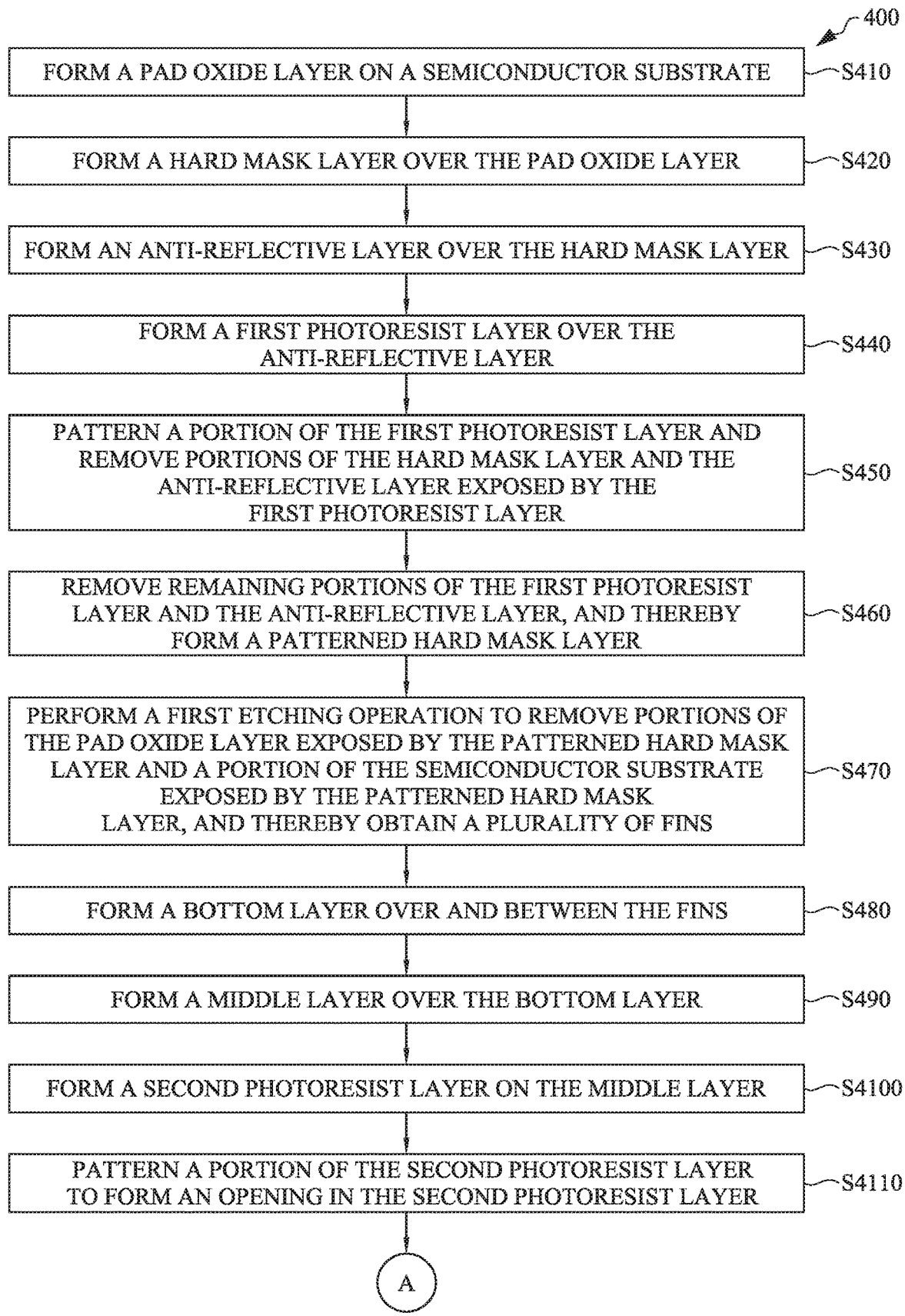
FIGS. 4A and 4B are flowcharts illustrating a method of manufacturing a semiconductor device according to an embodiment of the present disclosure.
Figure 4B:
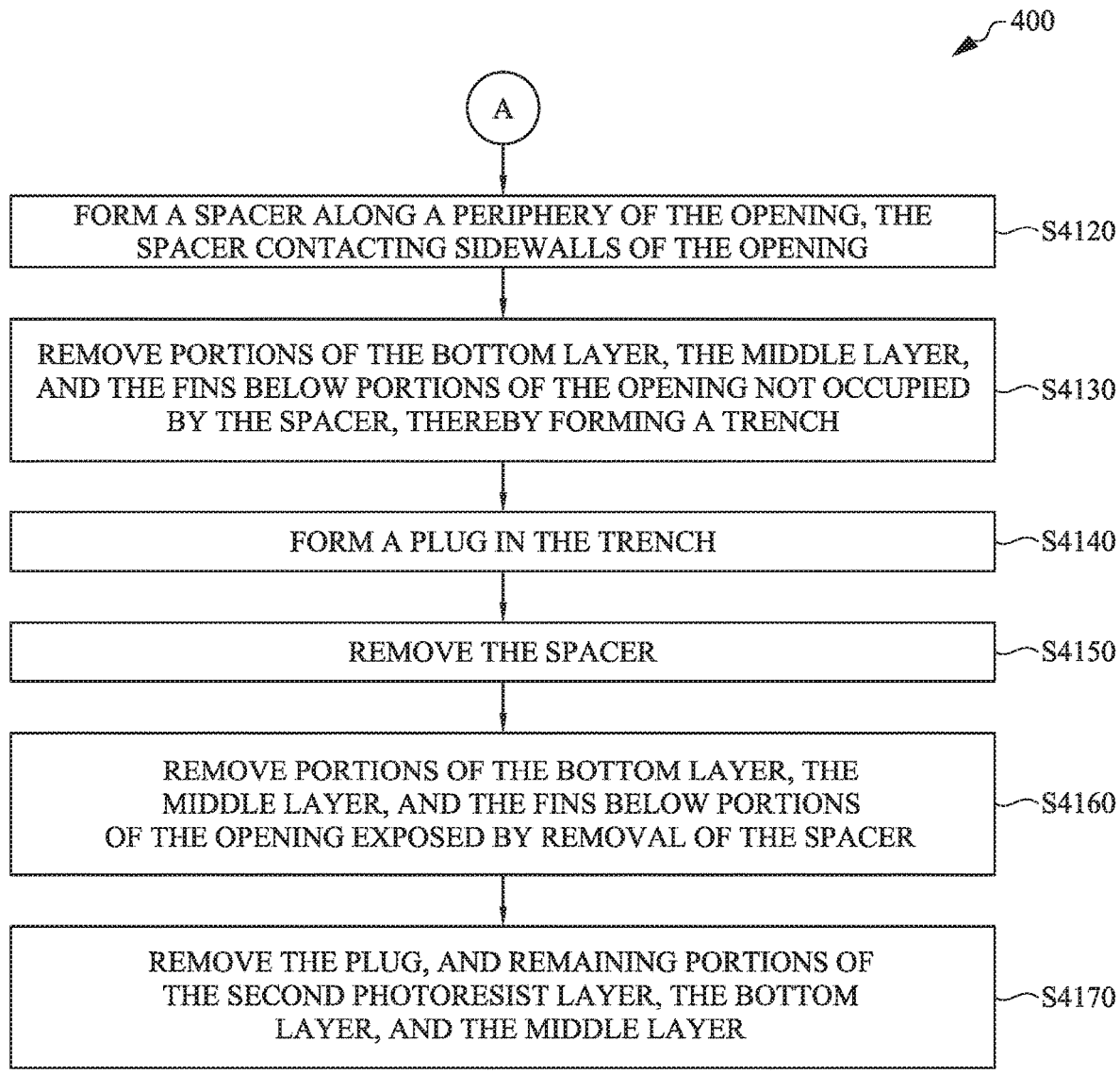

An embodiment of the present disclosure is a method 400 of manufacturing a semiconductor device according to the flowchart illustrated in FIGS. 4A and 4B. It is understood that additional operations can be provided before, during, and after processes discussed in FIGS. 4A and 4B, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method 400 includes an operation S410 of forming a pad oxide layer on a semiconductor substrate. In operation S420, a hard mask layer is formed over the pad oxide layer. In operation S430, an anti-reflective layer is formed over the hard mask layer. In operation S440, a first photoresist layer is formed over the anti-reflective layer. In some embodiments, the anti-reflective layer includes an organic film, an etch barrier layer, and a bottom anti-reflective coating (BARC). In operation S450, a portion of the first photoresist layer is patterned and portions of the hard mask layer and anti-reflective layer exposed by the first photoresist layer are removed. The first photoresist layer is patterned by selective exposure to actinic radiation in some embodiments, such as electromagnetic radiation including ultraviolet radiation and ultraviolet radiation, and particle beams, including electron beam and ion beam, followed by developing using a suitable developer. In operation S460, remaining portions of the first photoresist layer and the anti-reflective layer are removed and a patterned hard mask layer is formed. In operation S470, a first etching operation is performed to remove portions of the pad oxide layer exposed by the patterned hard mask layer and a portion of the semiconductor substrate exposed by the patterned hard mask layer, and a plurality of fins are obtained. In some embodiments, dry etching techniques, wet etching techniques, or a combination of dry etching techniques and wet etching techniques are used to perform the etching operations. In operation S480, a bottom layer is formed over and between the fins. In operation S490, a middle layer is formed over the bottom layer. In operation S4100, a second photoresist layer is formed on the middle layer. In operation S4110, a portion of the second photoresist layer is patterned to form an opening in the second photoresist layer. In operation S4120, a spacer is formed along a periphery of the opening and contacting sidewalls of the opening. In operation S4130, portions of the bottom layer, the middle layer, and the fins below portions of the opening not occupied by the spacer are removed, and a trench is thereby formed. In operation S4140, a plug is formed in the trench. In operation S4150, the spacer is removed. In operation S4160, portions of the bottom layer, the middle layer, and the fins below portions of the opening exposed by removal of the spacer are removed. In operation S4170, the plug, and remaining portions of the second photoresist layer, bottom layer, and the middle layer are removed.

Figure 5:
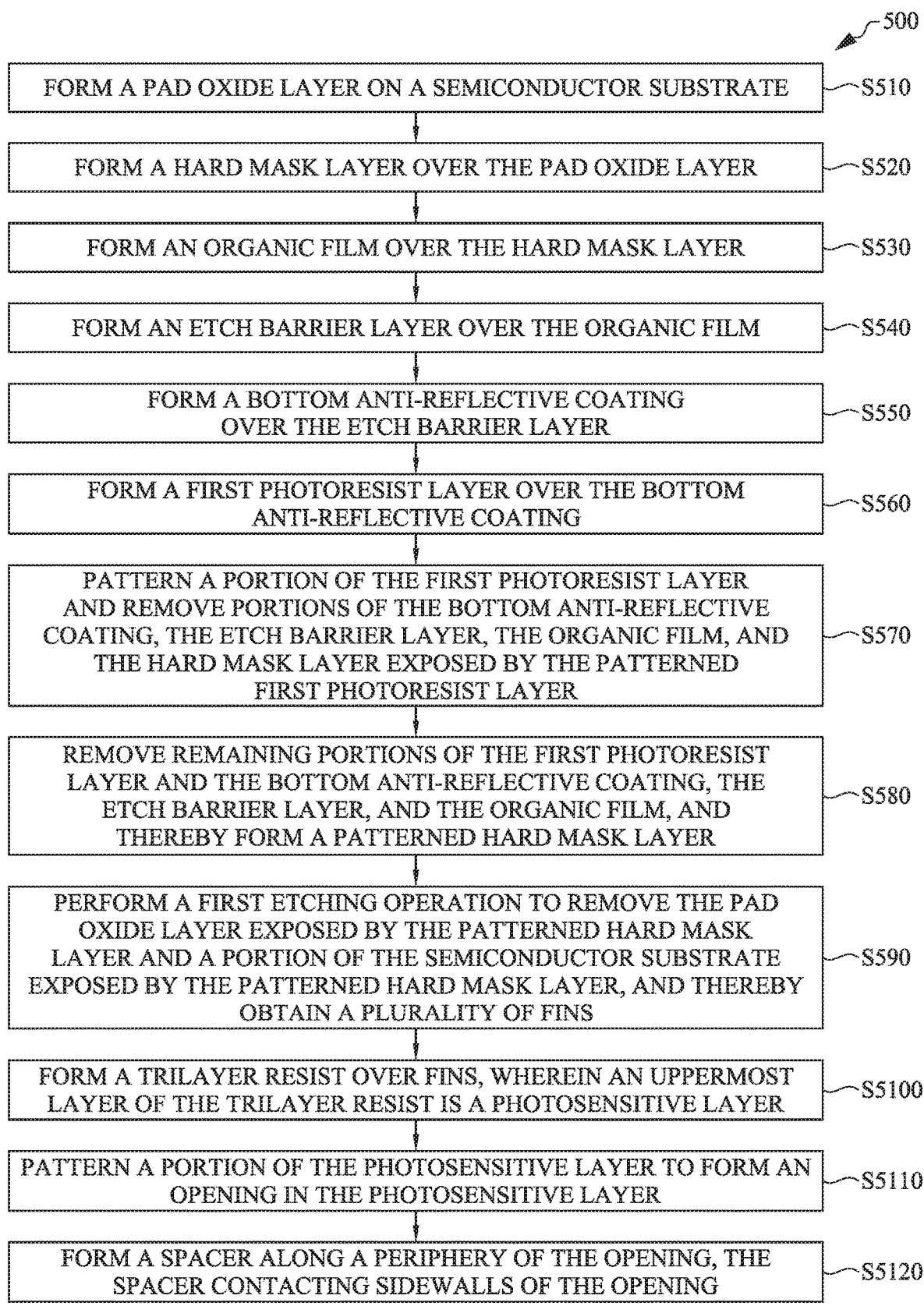
FIG. 5 is a flowchart illustrating a method of manufacturing a semiconductor device according to an embodiment of the present disclosure.

An embodiment of the present disclosure is a method 500 of manufacturing a semiconductor device according to the flowchart illustrated in FIG. 5. It is understood that additional operations can be provided before, during, and after processes discussed in FIG. 5, and some of the operations described below can be replaced or eliminated, for additional embodiments of the method. The order of the operations/processes may be interchangeable and at least some of the operations/processes may be performed in a different sequence. At least two or more operations/processes may be performed overlapping in time, or almost simultaneously.

The method 500 includes an operation S510 of forming a pad oxide layer on a semiconductor substrate. In operation S520, a hard mask layer is formed over the pad oxide layer. In some embodiments, the hard mask layer includes silicon nitride. In operation S530, an organic film is formed over the hard mask layer. In operation S540, an etch barrier layer is formed over the organic film. In some embodiments, the etch barrier layer comprises silicon oxynitride (SiON). In operation S550, a bottom anti-reflective coating (BARC) is formed over the etch barrier layer. In some embodiments, the organic film, the etch barrier layer, and the bottom anti-reflective coating (BARC) form an anti-reflective layer. In operation S560, a first photoresist layer is formed over the bottom anti-reflective coating. In operation S570, a portion of the first photoresist layer is patterned and portions of the bottom anti-reflective coating, the etch barrier layer, the organic film, and the hard mask layer exposed by the patterned first photoresist layer are removed. In operation S580, remaining portions of the first photoresist layer and the bottom anti-reflective coating, the etch barrier layer, and the organic film are removed, and a patterned hard mask layer is thereby formed. In operation S590, a first etching operation is performed to remove the pad oxide layer exposed by the patterned hard mask layer and a portion of the semiconductor substrate exposed by the patterned hard mask layer, and a plurality of fins are thereby obtained. In operation S5100, a trilayer resist is formed over the fins. An uppermost layer in the trilayer resist is a photosensitive layer, such as a photoresist layer. In operation S5110, a portion of the photosensitive layer is patterned to form an opening in the photosensitive layer. In operation S5120, a spacer is formed along a periphery of the opening and contacting sidewalls of the opening.

The various embodiments or examples described herein offer several advantages over the existing art. For example, using the processes/operations in the embodiments discussed above, the damage to the fins is minimized. The processes/operations are more efficient, less time consuming, and more economical. Additionally, in some embodiments only one plug process is required.

An embodiment of the disclosure is a method of manufacturing a semiconductor device, including forming a pad oxide layer on a semiconductor substrate. A hard mask layer is formed over the pad oxide layer. An anti-reflective layer is formed over the hard mask layer. A first photoresist layer is formed over the anti-reflective layer. A portion of the first photoresist layer is patterned and portions of the hard mask layer and anti-reflective layer exposed by the patterned first photoresist layer are removed. Remaining portions of the first photoresist layer and the anti-reflective layer are removed and a patterned hard mask layer is formed. A first etching operation is performed to remove portions of the pad oxide layer exposed by the patterned hard mask layer and a portion of the semiconductor substrate exposed by the patterned hard mask layer, and a plurality of fins are formed. A bottom layer is formed over and between the fins. A middle layer is formed over the bottom layer. A second photoresist layer is formed on the middle layer. A portion of the second photoresist layer is patterned to form an opening in the second photoresist layer. A spacer is formed along a periphery of the opening and contacting sidewalls of the opening. In an embodiment, a first plug is formed in portions of the opening not occupied by the spacer. In an embodiment, the spacer is removed. In an embodiment, a second etching operation is performed to remove portions of the bottom layer and the middle layer, and fins underneath portions of opening exposed due to removal of spacer, and trenches are formed. In an embodiment, second plugs are formed in the trenches. In an embodiment, the first plug is removed. In an embodiment, a third etching operation is performed to remove portions of bottom layer, middle layer, and fins between the second plugs. In an embodiment, the second plugs and remaining portions of the second photoresist layer, bottom layer, and middle layer are removed. In an embodiment, the anti-reflective layer includes an organic film, an etch barrier layer, and a bottom anti-reflective coating (BARC), and the anti-reflective layer is formed by forming the organic film over the hard mask layer, forming the etch barrier layer over the organic film, and forming the BARC over the etch barrier layer. In an embodiment, the etch barrier layer includes silicon oxynitride. In an embodiment, the hard mask layer includes silicon nitride. In an embodiment, the semiconductor substrate includes silicon. In an embodiment, portions of the bottom layer, the middle layer and the fins below portions of the opening not occupied by the spacer are removed and a trench is formed; a plug is formed in the trench; the spacer is removed; portions of the bottom layer, the middle layer and the fins below portions of an opening exposed by removal of the spacer are removed; and the plug, and remaining portions of the second photoresist layer, bottom layer, and the middle layer are removed.

In an embodiment, groups of fins on opposing sides of the trench are created by removing portions of the bottom layer, the middle layer, and the fins. In an embodiment, the spacer is removed to create an edge-cut. In an embodiment, removing portions of the fins below portions of the opening exposed by removal of the spacer removes one or more fins from the groups of fins one opposing sides of the trench. In an embodiment, removing the one or more fins from the groups of fins removes the one or more fins directly below the edge-cut.

Another embodiment of the disclosure is a method of manufacturing a semiconductor device, including forming a pad oxide layer on a semiconductor substrate. A hard mask layer is formed over the pad oxide layer. An anti-reflective layer is formed over the hard mask layer. A first photoresist layer is formed over the anti-reflective layer. A portion of the first photoresist layer is patterned and portions of the hard mask layer and anti-reflective layer exposed by the first photoresist layer are removed. Remaining portions of the first photoresist layer and the anti-reflective layer are removed, and a patterned hard mask layer is formed. A first etching operation is performed to remove portions of the pad oxide layer exposed by the patterned hard mask layer and a portion of the semiconductor substrate exposed by the patterned hard mask layer, and a plurality of fins are thereby obtained. A bottom layer is formed over and between the fins. A middle layer is formed over the bottom layer. A second photoresist layer is formed on the middle layer. A portion of the second photoresist layer is patterned to form an opening in the second photoresist layer. A spacer is formed along a periphery of the opening and contacting sidewalls of the opening. Portions of the bottom layer, the middle layer, and the fins below portions of the opening not occupied by the spacer are removed, and a trench is formed. A plug is formed in the trench. The spacer is removed and portions of the bottom layer, the middle layer, and the fins below portions of the opening exposed by removal of the spacer are also removed. The plug, and remaining portions of the second photoresist layer, bottom layer, and the middle layer are removed. In an embodiment, the anti-reflective layer includes an organic film, an etch barrier layer, and a bottom anti-reflective coating (BARC); the anti-reflective layer is formed by forming the organic film over the hard mask layer; the etch barrier layer is formed over the organic film; and the BARC is formed over the etch barrier layer. In an embodiment, the etch barrier layer includes silicon oxynitride (SiON). In an embodiment, the hard mask layer includes silicon nitride. In an embodiment, the semiconductor substrate includes silicon.

Still another embodiment of the disclosure is a method of manufacturing a semiconductor device, including forming a pad oxide layer on a semiconductor substrate. A hard mask layer is formed over the pad oxide layer. An organic film is formed over the hard mask layer. An etch barrier layer is formed over the organic film. A bottom anti-reflective coating (BARC) is formed over the etch barrier layer. A first photoresist layer is formed over the bottom anti-reflective coating. A portion of the first photoresist layer is patterned and portions of the bottom anti-reflective coating, the etch barrier layer, the organic film, and the hard mask layer exposed by the patterned first photoresist layer are removed. Remaining portions of the first photoresist layer and the bottom anti-reflective coating, the etch barrier layer, and the organic film are removed, and a patterned hard mask layer is formed. A first etching operation is performed to remove the pad oxide layer exposed by the patterned hard mask layer and a portion of the semiconductor substrate exposed by the patterned hard mask layer, and a plurality of fins are obtained. A trilayer resist is formed over the fins, and a photosensitive layer is the uppermost layer of the trilayer resist. A portion of the photosensitive layer is patterned to form an opening in the photosensitive layer. A spacer is formed along a periphery of the opening and contacting sidewalls of the opening. In an embodiment, a first plug is formed in portions of the opening not occupied by the spacer; the spacer is removed; a second etching operation is performed to remove portions of the trilayer resist and fins underneath portions of opening exposed by removal of spacer, and trenches are formed; second plugs are formed in the trenches; the first plug is removed; a third etching operation is performed to remove portions of the trilayer resist and fins between the second plugs; and the second plugs are removed and remaining portions of the trilayer resist are removed. In an embodiment, the second etching operation to remove fins underneath the portions of opening exposed by removal of the spacer is performed to crate groups of fins on opposing sides of a central group of fins and separated from the central group of fins by the trenches. In an embodiment, the third etching operation that is performed to remove fins between the second plugs removes the central group of fins.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a pad oxide layer on a semiconductor substrate;
    forming a hard mask layer over the pad oxide layer;
    forming an anti-reflective layer over the hard mask layer;
    forming a first photoresist layer over the anti-reflective layer;
    patterning a portion of the first photoresist layer and removing portions of the hard mask layer and anti-reflective layer exposed by the patterned first photoresist layer;
    removing remaining portions of the first photoresist layer and the anti-reflective layer, thereby forming a patterned hard mask layer;
    performing a first etching operation to remove portions of the pad oxide layer exposed by the patterned hard mask layer and a portion of the semiconductor substrate exposed by the patterned hard mask layer, thereby obtaining a plurality of fins;
    forming a bottom layer over and between the fins;
    forming a middle layer over the bottom layer;
    forming a second photoresist layer on the middle layer;
    patterning a portion of the second photoresist layer to form an opening in the second photoresist layer; and
    forming a spacer along a periphery of the opening, the spacer contacting sidewalls of the opening.

2. The method of claim 1, further comprising:
    forming a first plug in portions of the opening not occupied by the spacer;

removing the spacer;
performing a second etching operation to remove portions of the bottom layer and the middle layer, and fins underneath portions of opening exposed due to removal of spacer, thereby forming trenches;
forming second plugs in the trenches;
removing the first plug;
performing a third etching operation to remove portions of bottom layer, middle layer, and fins between the second plugs; and
removing the second plugs and remaining portions of the second photoresist layer, bottom layer, and middle layer.

3. The method of claim 2, wherein the anti-reflective layer includes an organic film, an etch barrier layer, and a bottom anti-reflective coating (BARC), and forming the anti-reflective layer comprises:
forming the organic film over the hard mask layer;
forming the etch barrier layer over the organic film; and
forming the BARC over the etch barrier layer.

4. The method of claim 3, wherein the etch barrier layer comprises silicon oxynitride.

5. The method of claim 3, wherein the hard mask layer includes silicon nitride.

6. The method of claim 3, wherein the semiconductor substrate comprises silicon.

7. The method of claim 1, further comprising:
removing portions of the bottom layer, the middle layer and the fins below portions of the opening not occupied by the spacer, thereby forming a trench;
forming a plug in the trench;
removing the spacer;
removing portions of the bottom layer, the middle layer and the fins below portions of an opening exposed by removal of the spacer; and
removing the plug, and remaining portions of the second photoresist layer, bottom layer, and the middle layer.

8. The method of claim 7, wherein removing portions of the bottom layer, the middle layer, and the fins below portions of the opening not occupied by the spacer creates groups of fins on opposing sides of the trench.

9. The method of claim 8, wherein removing the spacer includes removing the spacer to create an edge-cut.

10. The method of claim 9, wherein removing portions of the fins below portions of the opening exposed by removal of the spacer includes removing one or more fins from the groups of fins on opposing sides of the trench.

11. The method of claim 10, wherein removing the one or more fins from the groups of fins removes the one or more fins directly below the edge-cut.

12. A method of manufacturing a semiconductor device, comprising:
forming a pad oxide layer on a semiconductor substrate;
forming a hard mask layer over the pad oxide layer;
forming an anti-reflective layer over the hard mask layer;
forming a first photoresist layer over the anti-reflective layer;
patterning a portion of the first photoresist layer and removing portions of the hard mask layer and the anti-reflective layer exposed by the first photoresist layer;
removing remaining portions of the first photoresist layer and the anti-reflective layer, thereby forming a patterned hard mask layer;
performing a first etching operation to remove portions of the pad oxide layer exposed by the patterned hard mask layer and a portion of the semiconductor substrate exposed by the patterned hard mask layer, thereby obtaining a plurality of fins;
forming a bottom layer over and between the fins;
forming a middle layer over the bottom layer;
forming a second photoresist layer on the middle layer;
patterning a portion of the second photoresist layer to form an opening in the second photoresist layer;
forming a spacer along a periphery of the opening, the spacer contacting sidewalls of the opening;
removing portions of the bottom layer, the middle layer, and the fins below portions of the opening not occupied by the spacer, thereby forming a trench;
forming a plug in the trench;
removing the spacer;
removing portions of the bottom layer, the middle layer, and the fins below portions of the opening exposed by removal of the spacer; and
removing the plug, and remaining portions of the second photoresist layer, the bottom layer, and the middle layer.

13. The method of claim 12, wherein the anti-reflective layer includes an organic film, an etch barrier layer, and a bottom anti-reflective coating (BARC), and forming the anti-reflective layer comprises:
forming the organic film over the hard mask layer;
forming the etch barrier layer over the organic film; and
forming the BARC over the etch barrier layer.

14. The method of claim 13, wherein the etch barrier layer comprises silicon oxynitride (SiON).

15. The method of claim 12, wherein the hard mask layer includes silicon nitride.

16. The method of claim 12, wherein the semiconductor substrate comprises silicon.

17. A method of manufacturing a semiconductor device, comprising:
forming a pad oxide layer on a semiconductor substrate;
forming a hard mask layer over the pad oxide layer;
forming an organic film over the hard mask layer;
forming an etch barrier layer over the organic film;
forming a bottom anti-reflective coating over the etch barrier layer;
forming a first photoresist layer over the bottom anti-reflective coating;
patterning a portion of the first photoresist layer and removing portions of the bottom anti-reflective coating, the etch barrier layer, the organic film, and the hard mask layer exposed by the patterned first photoresist layer;
removing remaining portions of the first photoresist layer and the bottom anti-reflective coating, the etch barrier layer, and the organic film, thereby forming a patterned hard mask layer;
performing a first etching operation to remove the pad oxide layer exposed by the patterned hard mask layer and a portion of the semiconductor substrate exposed by the patterned hard mask layer, thereby obtaining a plurality of fins;
forming a trilayer resist over the fins, wherein an uppermost layer of the trilayer resist is a photosensitive layer;
patterning a portion of the photosensitive layer to form an opening in the photosensitive layer; and
forming a spacer along a periphery of the opening, the spacer contacting sidewalls of the opening.

18. The method of claim 17, further comprising:
forming a first plug in portions of the opening not occupied by the spacer;
removing the spacer;

performing a second etching operation to remove portions of the trilayer resist and fins underneath portions of opening exposed by removal of spacer, thereby forming trenches;

forming second plugs in the trenches;

removing the first plug;

performing a third etching operation to remove portions of the trilayer resist and fins between the second plugs; and removing the second plugs and remaining portions of the trilayer resist.

19. The method of claim 18, wherein performing the second etching operation to remove fins underneath the portions of opening exposed by removal of the spacer creates groups of fins on opposing sides of a central group of fins and separated from the central group of fins by the trenches.

20. The method of claim 19, wherein performing the third etching operation to remove fins between the second plugs removes the central group of fins.

* * * * *